(12) United States Patent
Gronenborn et al.

(10) Patent No.: US 9,048,633 B2
(45) Date of Patent: Jun. 2, 2015

(54) LASER DEVICE WITH CONFIGURABLE INTENSITY DISTRIBUTION

(75) Inventors: Stephan Gronenborn, Aachen (DE); Holger Moench, Vaals (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 523 days.

(21) Appl. No.: 13/391,303

(22) PCT Filed: Aug. 16, 2010

(86) PCT No.: PCT/IB2010/053687
§ 371 (c)(1),
(2), (4) Date: Jul. 25, 2012

(87) PCT Pub. No.: WO2011/021140
PCT Pub. Date: Feb. 24, 2011

(65) Prior Publication Data
US 2012/0281293 A1   Nov. 8, 2012

(30) Foreign Application Priority Data

Aug. 20, 2009  (EP) ..................................... 09168289
May 6, 2010   (EP) ..................................... 10162170

(51) Int. Cl.
| G02B 27/10 | (2006.01) |
| G02B 27/30 | (2006.01) |
| H01S 5/42 | (2006.01) |
| B23K 26/06 | (2014.01) |
| B23K 26/073 | (2006.01) |
| B41J 2/45 | (2006.01) |
| H01S 5/062 | (2006.01) |
| H01S 5/40 | (2006.01) |

(52) U.S. Cl.
CPC .............. *H01S 5/423* (2013.01); *B23K 26/0608* (2013.01); *B23K 26/073* (2013.01); *H01S 5/0624* (2013.01); *H01S 5/4012* (2013.01); *H01S 2301/18* (2013.01); *B41J 2/451* (2013.01)

(58) Field of Classification Search
USPC .................. 359/618, 619, 621–624, 626, 641
See application file for complete search history.

(56) References Cited

U.S. PATENT DOCUMENTS

| 4,428,647 A | 1/1984 | Sprague et al. |
| 5,903,590 A | 5/1999 | Hadley et al. |
| 6,353,502 B1 | 3/2002 | Marchant et al. |
| 2002/0129723 A1 | 9/2002 | Beier et al. |
| 2006/0227836 A1 | 10/2006 | Omori et al. |

FOREIGN PATENT DOCUMENTS

GB       2442767 A       4/2008

OTHER PUBLICATIONS

C. Singh et al., "Simulation and optimization of the intensity profile of an optical transmitter for high-speed wireless local area networks", 17th International Conference of Optoelectronics, Fiber Optics and Photonics, Dec. 9-11, 2004, Cochin University of Science and Technology, Kerala, Paper LTW-P2.

*Primary Examiner* — Jack Dinh

(57) ABSTRACT

The present invention relates to a laser device comprising an array of several large area VCSELs (101) and one or several optics (201, 202) designed and arranged to image the active layers of the VCSELs (101) of said array to a working plane (501) such that the laser radiation emitted by the active layers of all VCSELs (101) or of subgroups of VCSELs (101) of the array superimposes in the working plane (501). The proposed laser device allows the generation of a desired intensity distribution in the working plane without the need of an optics specially designed for this intensity distribution or beam profile.

18 Claims, 15 Drawing Sheets

LASER DEVICE WITH CONFIGURABLE INTENSITY DISTRIBUTION

FIELD AND BACKGROUND OF THE INVENTION

The present invention relates to a laser device comprising an array of vertical cavity surface emission lasers (VCSELs). Vertical cavity surface emitting laser diodes are one of the most promising laser sources and offer many advantages compared to edge emitters, like addressable 2D-array arrangements, on-wafer testing and circular beam shapes.

Small area oxide-confined VCSELs are known to emit Gauss modes. Higher output powers can be achieved by larger active areas, but the emission changes to distributions best described by Fourier modes. The near field of the laser beam fills the complete pumped active area or emission area of the laser, which is e.g. determined by the shape of the oxide-aperture, by the shape of the proton implantation, by the shape of the mesa or by the shape of the contact geometry of the laser diode. By appropriately setting these shapes it is thus possible to generate different shapes of intensity distribution in the near field of a large area VCSEL like for example square, circular, elliptical or flower-petal shapes.

For many laser applications, especially in material processing or medical applications, special intensity distributions are required in the working plane, e.g. top-hat circular or rectangular shapes, lines or ring structures. Some applications require homogenous line-shaped intensity profiles, in particular with a very good uniformity along the line direction. An example is the drying of ink in a professional printing machine with a laser line up to 1.5 m and only some mm thick. Beam homogenizers consisting of one or several lens arrays and at least one Fourier lens can be applied to shape the laser beam to the desired intensity distribution but have to be carefully aligned in the beam. Furthermore, due to the coherence of the laser beam unwanted artifacts can appear. C. Singh et al., "Simulation and optimization of the intensity profile of an optical transmitter for high-speed wireless local area networks" 17$^{th}$ International Conference of Optoelectronics., Fiber Optics and Photonics, Dec. 9-11, 2004, Cochin University of Science and Technology, Kerala, Paper LTW-P2, disclose a vertical cavity surface emitting laser array-based multi beam transmitter with an optimized intensity profile. Using small area VCSELs with a Gaussian intensity profile and a special matrix type diffractive element in front the array, the intensity distributions of the individual VCSELs in the working plane are partially superimposed to achieve a uniform intensity distribution in the working or receiver plane.

In the known laser devices, a special optics has to be used and carefully aligned to generate a desired intensity distribution in the working plane. Furthermore, this intensity distribution can not be switched to a different shape without replacing the complete optics in front of the laser. This requires tailored systems for each application of such a laser.

SUMMARY OF THE INVENTION

It is an object of the present invention to provide a laser device which allows a generation of a desired intensity distribution in the working plane without the need of an optics specially designed for this intensity distribution or beam profile.

The object is achieved with the laser device according to claim 1. Advantageous embodiments of the laser device are subject matter of the dependent claims or are described in the subsequent portions of the description.

The proposed laser device comprises an array of several large area VCSELs and one or several optics designed and arranged to image the active layers of the VCSELs of said array to a working plane such that the laser radiation emitted by the active layers of all VCSELs or of subgroups of VCSELs of the array superimposes in the working plane.

Due to this imaging of the active layers of the VCSELs to the working plane, images of the near field intensity distribution of each VCSEL are superimposed in the working plane, preferably with the central axes or centers of the near field intensity distributions coinciding or nearly coinciding in the working plane. The feature of imaging the active layers in this context does not necessarily mean to generate a sharp image. The imaging of the active layers may also result in a non-sharp image in the working plane.

A large area VCSEL is a VCSEL in which the laser emission is dominated by Fourier modes. Such a large area VCSEL typically has an emission area of $\geq 80\,\mu m^2$, preferably $\geq 300\,\mu m^2$. Since the near field intensity distribution of a large area VCSEL, unlike that of small area VCSELs, can be determined by the geometrical shape of the emission area or emission aperture of the VCSEL, the superimposed field intensity distribution in the working plane is determined by these shapes. In order to achieve a desired intensity distribution it is thus only necessary to provide VCSELs with the corresponding shapes of the emission area or emission aperture. Different intensity profiles in the working plane can thus be generated with the same optics only by providing VCSELs with different shapes of the emission area or emission aperture. VCSEL arrays can be fabricated on a wafer level with high precision regarding the geometrical parameters. Therefore, a laser device with a desired intensity profile can be fabricated with a high reliability and reproducibility.

The invention thus suggests using the properties of large area VCSELs to create adapted intensity distributions of the laser radiation. The near field of several VCSELs is imaged in the desired working distance. The near field intensity distribution can be set by the shape of the oxide aperture, the shape of the proton implantation, the shape of the mesa or the shape of the contact geometry of the VCSEL. The corresponding shape is adapted to the desired intensity distribution, for example square, rectangular, circular, elliptical etc. With the use of the optics the images of the lasers are overlapped in the working plane. The optics can comprise one or several micro lens arrays, collimating the emission from the single lasers, and one ore more lenses focusing the total laser radiation in the working plane as well as other optical elements to change or shape the laser beams. The array may comprise VCSELs or subgroups of VCSELs with identical shapes of the near field intensity distribution, which are then overlapped in the working plane to provide an intensity distribution with this shape. The array may also comprise VCSELs or subgroups of VCSELs with different shapes of the near field intensity distribution, which are then overlapped in the working plane to provide an intensity distribution determined by the superposition of the different shapes.

In an advantageous embodiment, the laser device comprises an array of at least a first and a second vertical cavity surface emission laser being individually switchable. The first VCSEL is designed to emit a laser beam with a first shape of its intensity distribution in the near field. The second VCSEL is designed to emit a laser beam with a second shape of its intensity distribution in the near field different from the first shape.

By using an addressable array of VCSELs with different shapes of the near field intensity distribution, the beam profiles at the working plane can be switched and shaped electrically by adjusting the driving currents through the different VCSELs. This allows a switching of the laser beam profile in the working plane in a simple manner.

Depending on the intended application of this embodiment, the array at minimum may comprise two different VCSELs, i.e. two VCSELs with different shapes of intensity distribution in the near field. The shape of the beam profile in the working plane can than be switched between these two shapes—when operating only one of the two VCSELs—or to a mixture of the two shapes—when operating both VCSELs at the same time. It is obviously also possible to use more than one of the first and second VCSELs in order to increase the output power of the laser device. All of these VCSELs may be individually switchable or switchable in groups, for example all VCSELs of one type and all VCSELs of the second type.

In order to increase the possible shapes of the intensity distribution in the working plane, preferably a third and even further VCSELs are provided in the array, the third and further VCSELs having shapes of intensity distribution in the near field which are different from the first and second shape and from one another. The resulting intensity distribution in the working plane is determined by the shapes of the VCSELs operated at the same time and by the magnification of the optics.

In a further embodiment of the laser device, a multitude of n large area VCSELs with shapes of the emission area matched to desired intensity distribution and with n micro lenses mounted close to each VCSEL and another multitude of m field lenses (n=a*m) to superimpose the images of each of the n/m subgroups of VCSELs is provided, wherein a=2, 3, 4, . . . . The resulting intensity distribution in this embodiment is a number of m spots each determined by the shape of the VCSELs of each subgroup operated at the corresponding time and the magnification. In this embodiment, the intensity distribution is thus averaged over each subgroup. All VCSELs of each subgroup may be commonly switched by a control unit, independent of the VCSELs of the other subgroups. Nevertheless, it is also possible to commonly switch all VCSELs of the array or to additionally allow the individual dimming and/or switching of each VCSEL of a subgroup.

In a further advantageous embodiment of the laser device the optics is designed and arranged to image the active layers of adjacent subgroups of lasers side by side so as to generate a continuous laser line in the working plane. The superimposed images formed of each subgroup touch or slightly overlap to form the continuous line. Preferably, the lasers of each subgroup in such a case are designed to emit laser beams with rectangular or parallelogram like shapes of intensity distribution in the near field having a longer extension in the direction of the line to be formed, referred to as first direction or x-direction, than in the direction of the line thickness, referred to as second direction or y-direction. In the y-direction a strong focusing is needed, while a strong averaging and overlapping of the intensity profiles of many individual layers is preferred. In order to achieve a continuous laser line having a large extension of e.g. >1 m in x-direction and only a small extension of e.g. <5 mm in y-direction, several measures are possible, which can also be combined:

- a small dimension of the emitting area in the y-direction and a large dimension in the x-direction, which is possible with VCSELs having an elongated shape, e.g. a rectangular shape with an aspect ratio >2:1 (or also parallelogram shape, trapez, triangle, . . . );
- a different pitch (=distance) between the centers of individual VCSELs in the y-direction and in the x-direction;
- different focal lengths in both directions by the use of 2 cylindrical lens arrays which are rotated by 90° with respect to each other and placed at a distance from the lasers equal to the focal length of that array divided by the refractive index of the material between the laser and the lens.

In a further embodiment of the laser device, the optics comprises an array of micro lenses, said micro lenses having an elongated aperture, in particular an elliptical or rectangular aperture, with a longer extension in the first direction than in a second direction perpendicular to the first direction.

In another embodiment of the laser device, the optics comprises a first and a second array of cylindrical micro lenses being arranged one behind the other between the lasers and the working plane, the cylindrical micro lenses of the first array being oriented with their cylinder axis perpendicular to the first direction, the cylindrical micro lenses of the second array being oriented with their cylinder axis perpendicular to a second direction, the second direction being perpendicular to the first direction, and having a different focal length than the cylindrical micro lenses of the first array in order to allow a stronger focussing of the laser radiation in the second direction than in the first direction.

In a further embodiment of the laser device according, an array of cylindrical lenses is arranged between the array of micro lenses and the working plane, such that a step like intensity profile is achieved in the first direction.

In another embodiment of the laser device, the optics comprises an array of micro lenses, said micro lenses having an elongated aperture, in particular an elliptical or rectangular aperture, with a longer extension at an angle of between >0° and ≤45° to the first direction.

In a further embodiment of the laser device, the optics comprises a first and a second array of cylindrical micro lenses being arranged one behind the other between the lasers and the working plane, the cylindrical micro lenses of the first array being oriented with their cylinder axis at an angle of between ≥45° and <90° to the first direction, the cylindrical micro lenses of the second array being oriented with their cylinder axis at an angle of between ≥45° and <90° to a second direction, the second direction being perpendicular to the first direction, and having a different focal length than the cylindrical micro lenses of the first array in order to allow a stronger focussing of the laser radiation in the second direction than in the first direction.

In case of overlapping superimposed images it is advantageous to design the lasers of each subgroup to emit laser beams with rectangular shapes of different dimensions in the near field, said dimensions being selected to generate a superimposed intensity profile having a constant central part and stepwise decreasing edges in the working plane. This allows the generation of a continuous line with a constant intensity along the line. Instead of the generation of a continuous line appropriate shapes of the superimposed images of each subgroup may also be projected side by side, touching or slightly overlapping each other, in a 2-dimensional manner in the working plane in order to form a continuous area of a desired dimension and shape.

Such a laser device generating a continuous laser line can be used for printing, roll to roll manufacturing processes and other objects passing below the heating line in a direction perpendicular to the line direction. Examples are the generation of a drying line in a printing machine, for drying/hardening of a coating, a glue or for lamination, for soldering or plastic welding or for semiconductor annealing. Other applications are heating of metal or plastics, epilation, skin treatment or drying of glue and paint in production.

The optics used in front of the VCSEL array in one embodiment comprises an array of micro lenses, each micro lens being positioned in front of and close to the corresponding VCSEL, and one or several near field lenses in front of the micro lens array. The optics may comprise the same magnification for all VCSELs of the array but may also provide different magnification factors for different subgroups of the array. Different magnification factors for individual subgroups of the array may be realized for example by different radii and distances of the micro lenses to the active layer.

In a further embodiment, the optics may comprise an array of micro lenses mounted close to each VCSEL, wherein distance to the active layer and focal length of the micro lenses are chosen to image the shape of the VCSEL to the working plane. Off axis mounting of the micro lenses regarding the central VCSEL axis or beam axis allows to superimpose all images of the array or of individual subgroups of the array in the working plane.

In order to further influence the intensity distribution in the working plane, the optics may be designed such that a non sharp image of the intensity distributions in the near field of the VCSELs is formed in the working plane. This may be achieved by adapting the radii or distances of the micro lenses and yields a smeared out and smooth intensity distribution for the corresponding subgroup or array. This also allows further modifications of the normal top-hat intensity distribution.

The switching of the geometrical shape of the intensity distribution in the working plane is obtained by switching between different combinations of VCSELs of the VCSEL array. This may be achieved by individually switching the single VCSELs or by switching between different subgroups of VCSELs. Therefore, through individual electrical addressing of the VCSELs or subgroups different intensity distributions can be generated in the working plane. It is also possible to continuously dim the single VCSELs or subgroups. The result is a very large degree of freedom in the adjustment of the desired intensity profile.

BRIEF DESCRIPTION OF THE DRAWINGS

The proposed laser device is described in the following by way of example in connection with the accompanying figures without limiting the scope of protection as defined by the claims. The figures show:

DETAILED DESCRIPTION OF EMBODIMENTS

Figure 1:
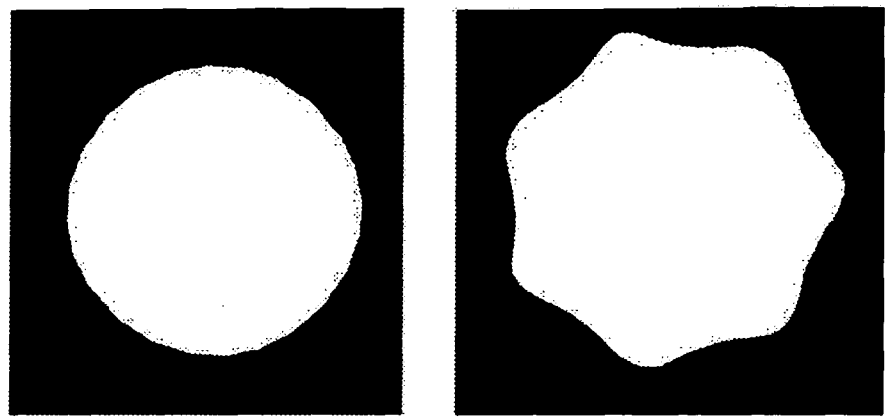
FIG. 1 two examples of a shape of the near field intensity distribution of a VCSEL.

The intensity distribution of large area VCSELs in the near field can be set by the shape of the oxide aperture of the VCSEL, by the shape of the proton implantation, by the shape of the mesa or by the shape of the contact geometry of the VCSEL. FIG. 1 shows two examples of such an intensity distribution in the near field achieved with different shapes of the oxide aperture. On the left hand side a circular shape is achieved by a circular oxide aperture. The flower petal shaped intensity distribution on the right hand side is achieved by an oxide aperture having the same shape. The intensity profile of both examples is quite homogeneous and has sharp edges for the large angle Fourier modes, only slightly modulated by an interference pattern (not depicted in the figure). Using two large area VCSELs with oxide apertures of the above two shapes in the proposed laser device, it is possible to switch the intensity distribution in the working plane between these two shapes of the intensity profile only by switching between the two VCSELs. When operating the two VCSELs at the same time, an intensity profile of the two superimposed intensity profiles is achieved. Depending on the shape of the pumped region of the VCSELs used in the array, a multitude of the different shapes of the intensity profile can be generated with the proposed laser device only by appropriate electrical control of the individual VCSELs. The switching between different shapes of the intensity profile in the working plane does not require any change of the optics in front of the VCSEL array.

Figure 2:
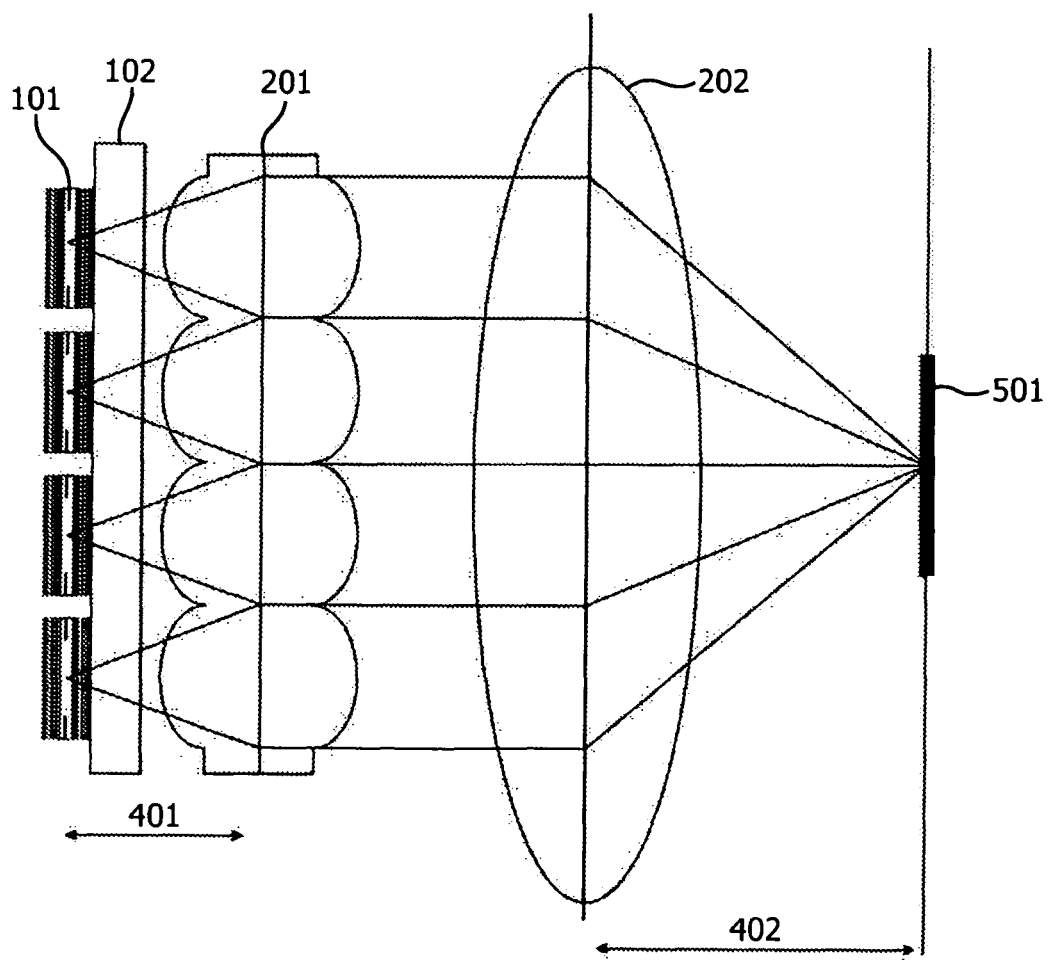
FIG. 2 a schematic view of a first embodiment of the proposed laser device.

FIG. 2 shows an embodiment of the proposed laser device in a schematic view. The laser device consists of an array of large area VCSELs 101, monolithically integrated on a substrate 102. The emission of the lasers is collimated with a micro lens array 201, where the distance 401 between the active layers of the VCSELs and the micro lenses is equal to the effective focal length of these micro lenses. The second lens 202 combines the images in a distance 402 equal to its focal length on the working plane 501. The magnification of the images is set by the ratio of the focal length of the micro lenses and the second lens 202. The shape of the emission area of the single VCSELs determines the intensity profile in the working plane 501. By selecting the shapes of these VCSELs appropriately, a desired intensity profile can be generated in the working plane. In addition, when selecting at least two VCSELs 101 of the VCSEL array to have a different shape of the oxide aperture or other features which lead to a different shape of the intensity distribution in the near field, and to be individually switchable, the switching between these two intensity distributions can be achieved by switching between these lasers.

Figure 3:
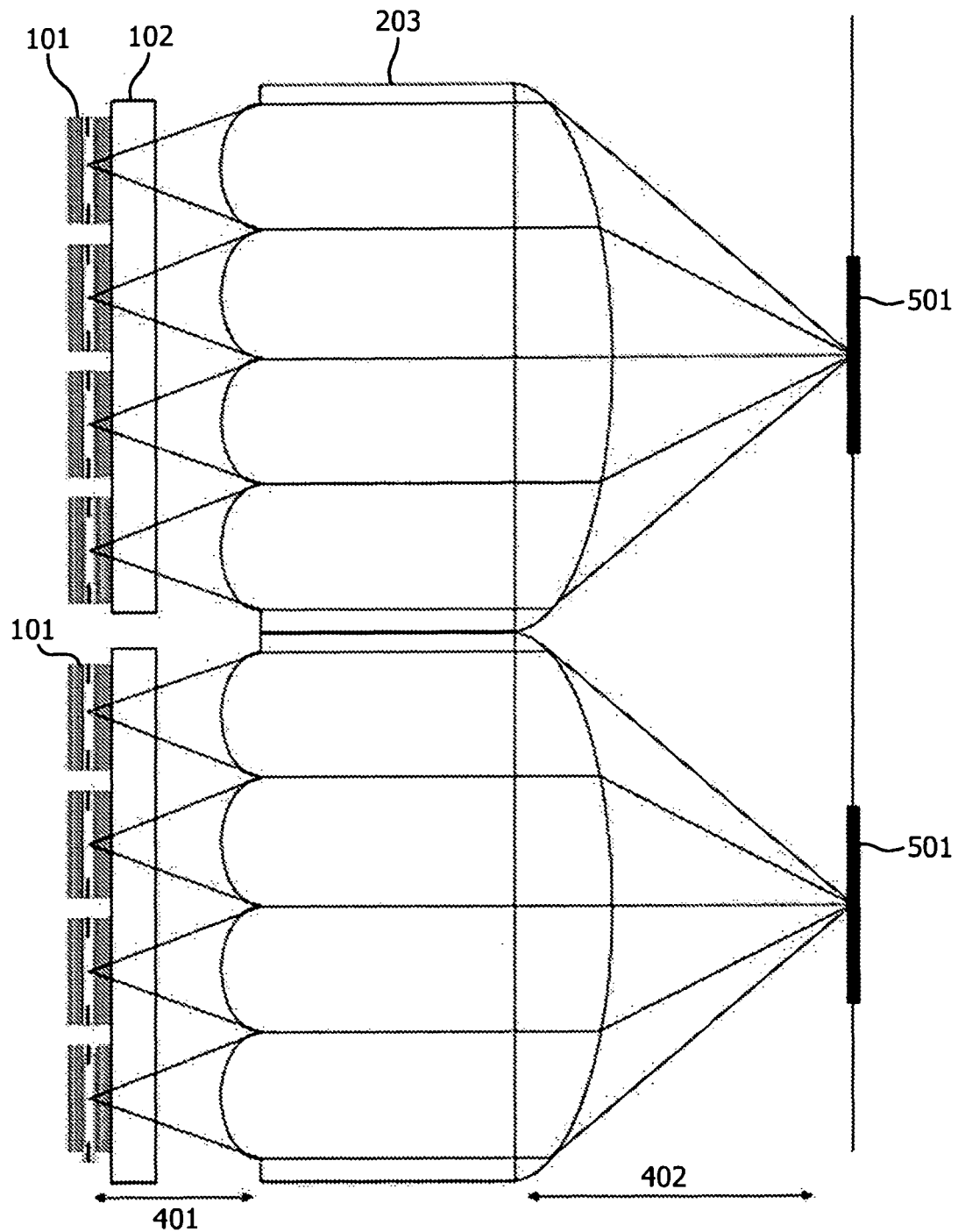
FIG. 3 a schematic view of a second embodiment of the proposed laser device.

In another embodiment of the proposed laser device according to FIG. 3, the second lens is integrated on the substrate 203 comprising the micro lenses. This configuration also allows stacking of several laser devices, as exemplary shown in FIG. 3 for two laser devices. The whole laser device then comprises two subgroups of VCSELs 101. The near field optics for each subgroup images the intensity distribution of its VCSELs to one position at the working plane 501 which is different from the position of the other subgroups. By individually addressing each subgroup, for example printing applications may be realized.

Figure 4:
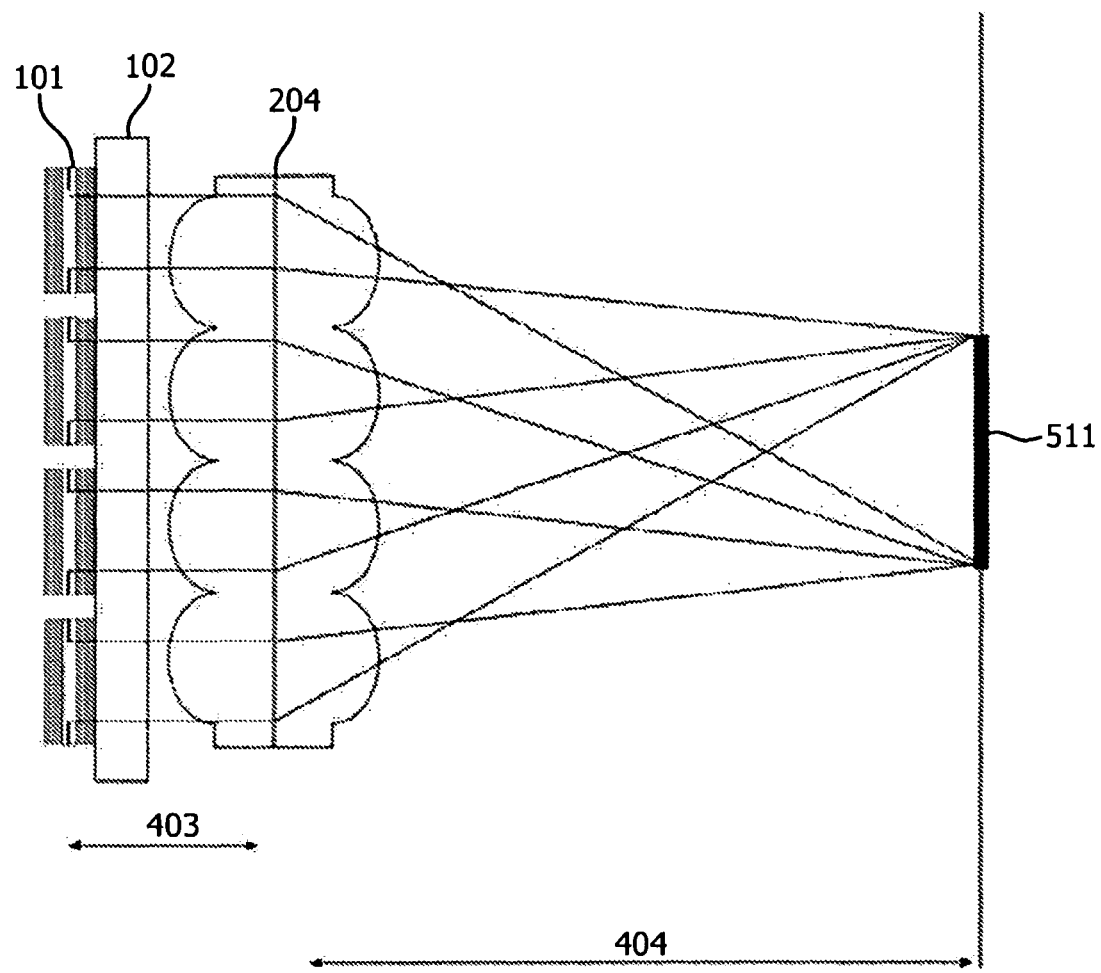
FIG. 4 a schematic view of a third embodiment of the proposed laser device.

FIG. 4 shows a further embodiment of the proposed laser device in which a chirped micro lens array 204 is used. This chirped micro lens array has a pitch between the single lenses which is slightly smaller than the pitch between the VCSELs 101 of the VCSEL array. The distance 403 is such that each micro lens images one laser in the distance 404. Due to the chirp, all images overlap in the working plane to one single image 511 and the intensity distribution is given by the sum of all near fields, slightly smeared out, because the images do no lay on parallel planes.

Figure 5:
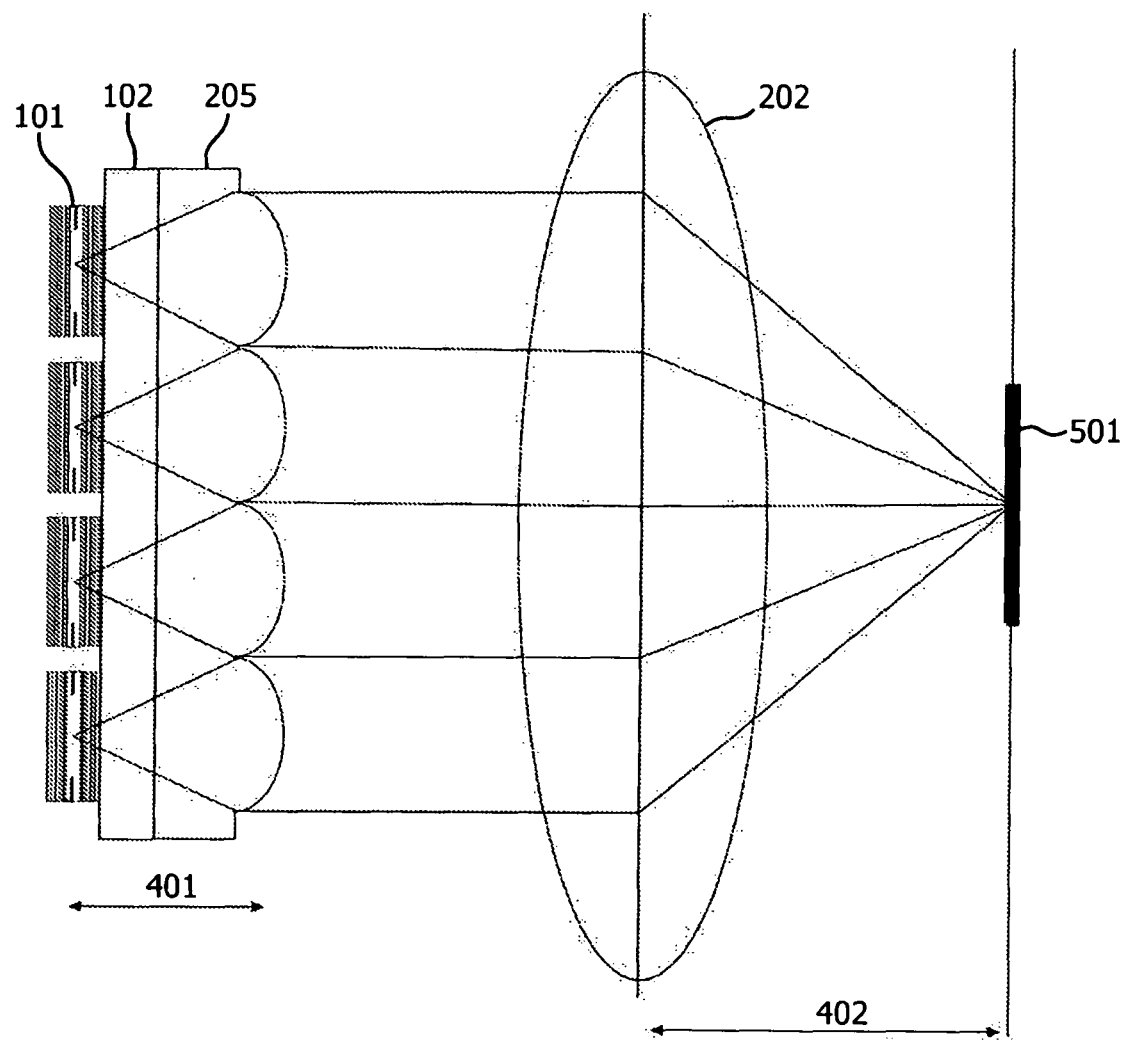
FIG. 5 a schematic view of a fourth embodiment of the proposed laser device.
Figure 6:
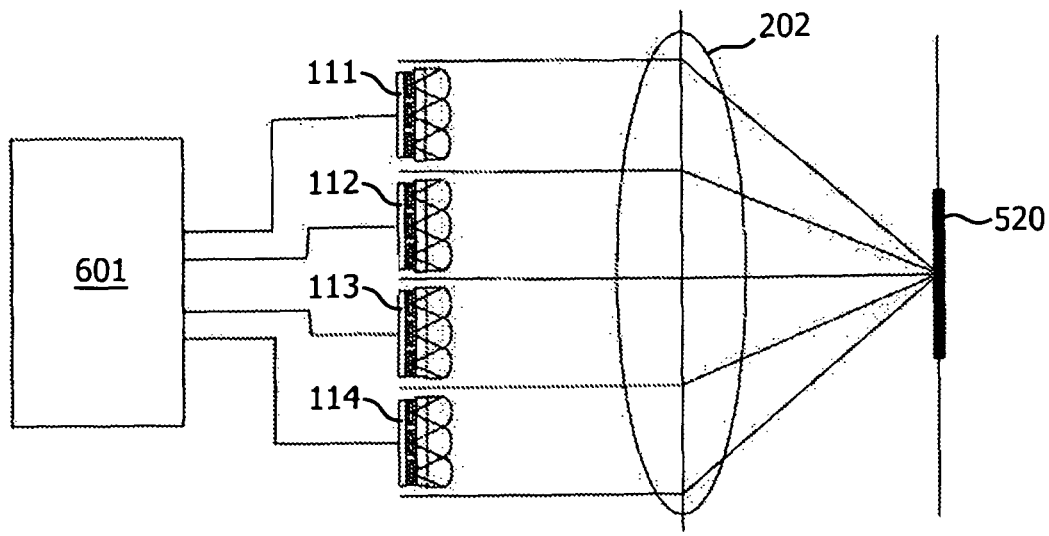
FIG. 6 a schematic view of a fifth embodiment of the proposed laser device.

FIG. 5 shows a further embodiment of the proposed laser device. In this embodiment, the micro lens array 205 is directly mounted on the laser substrate 102 by bonding. With this measure, the alignment effort and costs are reduced since the fabrication may be made by a wafer level process.

In an even more versatile embodiment of the proposed laser device several subgroups 111 to 114 of VCSELs of different shape of the emission areas, and optionally also of different size, are provided, which can be addressed individually by a control unit 601. By adjusting the power levels of the different subgroups, the desired intensity distributions 520 in the working plane can be set.

Figure 7:
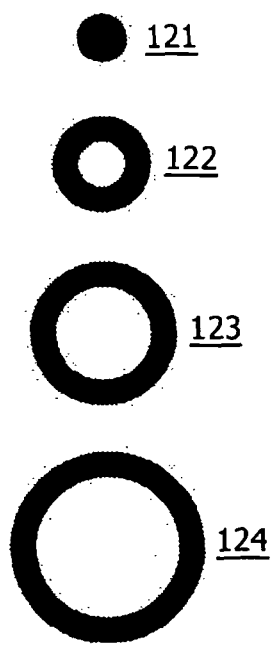
FIG. 7 exemplary shapes of the emission area of the VCSELs of the array.
Figure 8:
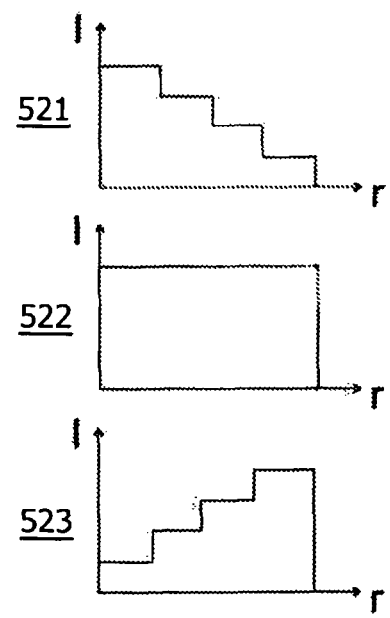
FIG. 8 exemplary intensity distributions in the working plane.

In this example, the shapes of the pumped region of the different VCSELs in the subgroups 111 to 114 are shown in FIG. 7. The figures shows four different shapes 121 to 124 of the pumped region and thus of the intensity distribution in the near field of the VCSELs. With this example, round beam profiles varying from a stepped Gauss like distribution 521, over a top-hat distribution 522 to a dipped top-hat 523 can be achieved with less or even no intensity in the central region (see FIG. 8). These different intensity distributions 521 to 523 in working plane 520 can be achieved only by appropriately controlling the different sub groups 111 to 114. Of course other and more complex intensity patterns are possible by choosing square or rectangular, round or elliptical shapes of the pumped region and thus of the emission area of the VCSELs. Also many other shapes work quite well for large diameter lasers.

In order to improve the control of the different VCSELs of the array, the power level coming from each subgroup can be measured and supplied to a feedback loop to the control unit. The power level can for example be measured by time multiplexing or by splitting off a small fraction of each beam. With this measure, the intensity distribution in the working plane can be exactly controlled.

Some applications for laser require homogenous line-shaped intensity profiles, meaning top-hat rectangular profiles with a high ratio of the side lengths. Applications can be heating of metal or plastics, epilation, skin treatment or drying of glue and paint in production.

Laser lines made from a high-power laser with diffractive optical elements (DOE) are limited in useful sizes and also homogeneity. In addition, such devices are not scalable without the change of the DOE. Laser lines made from fibre-coupled diode laser bars have very tight adjustment tolerances and are very costly.

Figure 9:
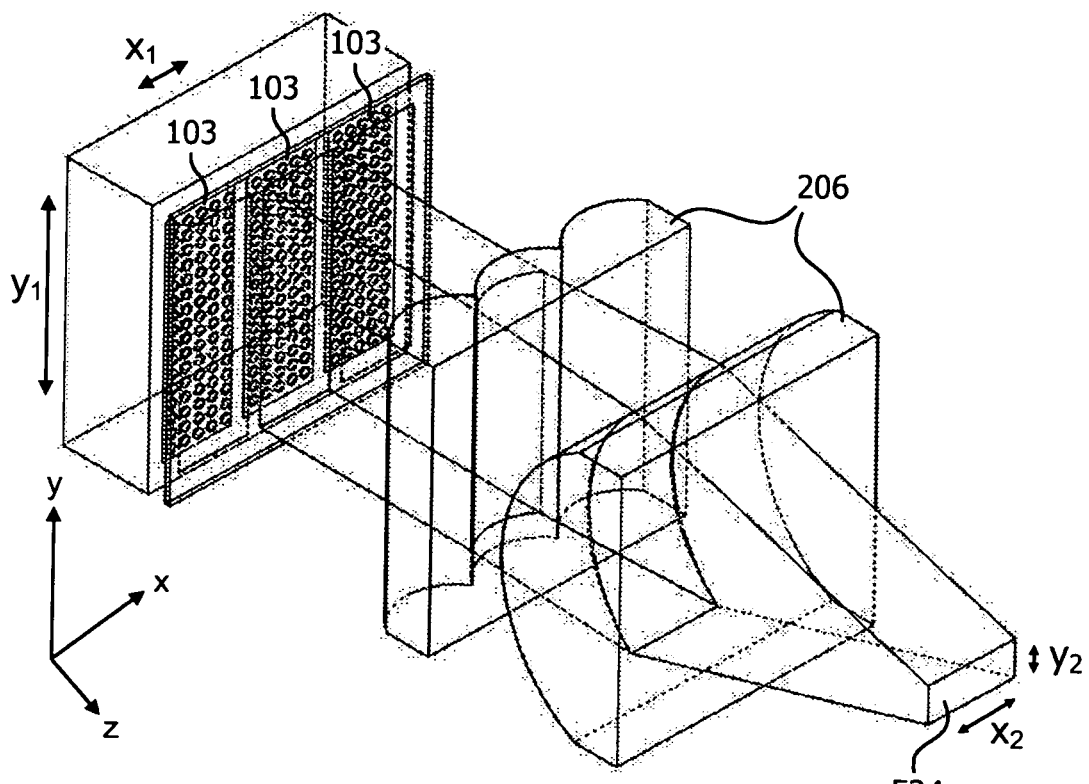
FIG. 9 an example of stacked laser modules with optics and intensity profile of the middle module.
Figure 10:
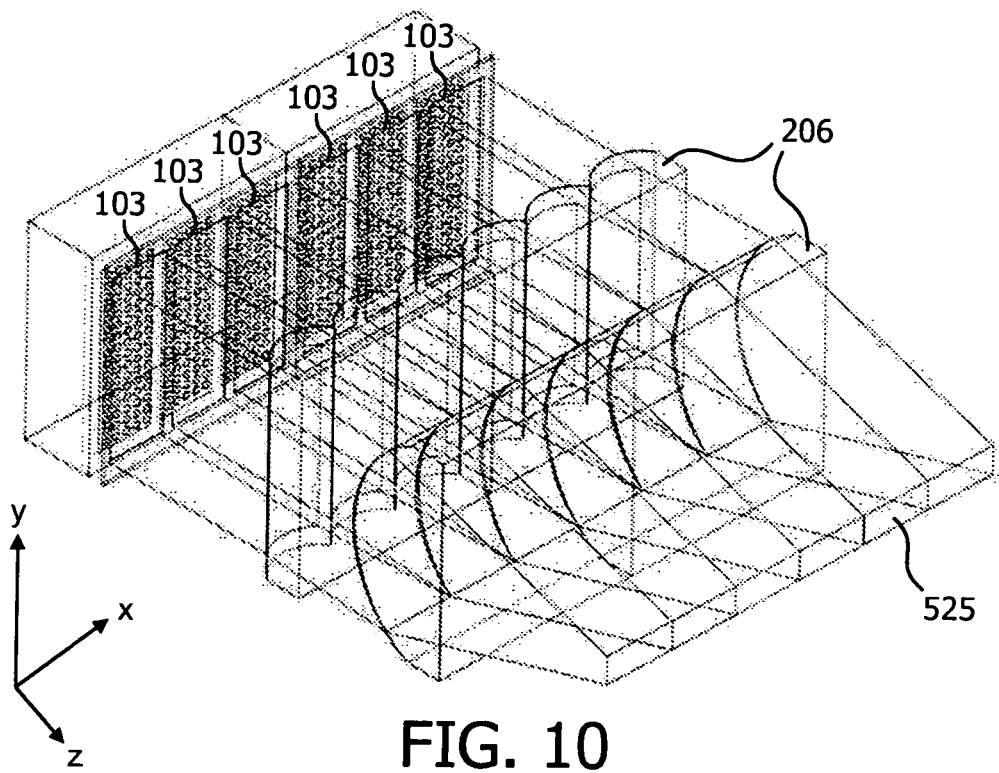
FIG. 10 an example of the generation of a laser line by stacking 6 laser modules.

Using a device according to the present invention such a laser line can be generated in a simple manner. The array of the laser device for this task comprises multitude of adjoined subgroups of VCSELs. Each subgroup creates a homogenous intensity distribution of laser radiation which is part of the laser line. The single subgroups of the array in such a case may be formed of individual laser modules 103, each module comprising an array of VCSELs. The dimensions $x_2$ and $y_2$ of the intensity distribution 524 in the working plane are determined by the size and shape of the emission area of the lasers of the laser modules 103, the focal length of the micro-lenses in front of each laser and the focal length of the macroscopic lenses 206 (see FIG. 9). $x_2$ shall be larger than the length $x_1$ of one laser module 103, such that the profiles can be stacked beside each other forming a continuous laser line 525 as shown in FIG. 10 for six laser modules 103. This allows closing the gaps between the stacked laser modules 103, which are necessary for electric connections, cooling, optic mounts, etc.

The homogeneity of the intensity or more precisely the integrated intensity in y-direction is very important to achieve homogenous temperature profiles on the working piece. As intensity profiles with steep edges need tight adjustment tolerances for stacking, preferably special intensity profiles are generated, which allow more tolerances. This can be e.g. parallelogram-shaped intensity profiles or rectangular profiles with step-like edges in the x-direction (regarding the intensity), as the overlapping peaks or holes in the intensity distribution are smeared out over a longer distance in x-direction.

Figure 11:
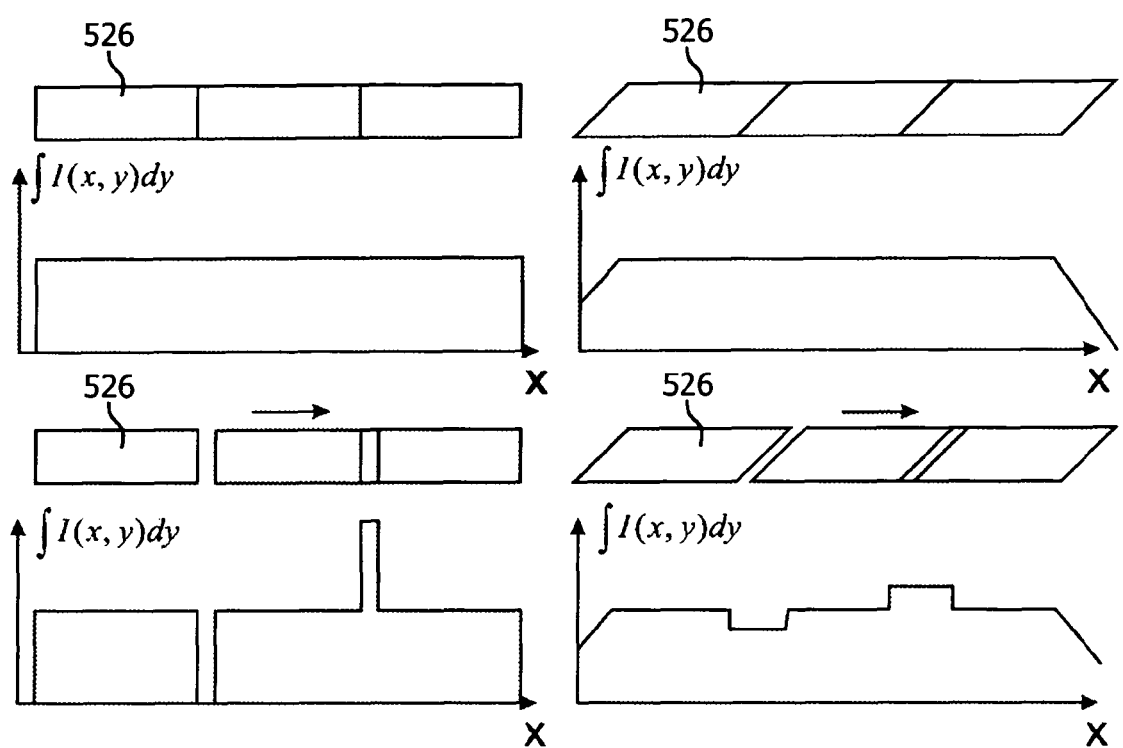
FIG. 11 stacking of different beam profiles and the influence of misalignment on the integrated intensity.

This is exemplary shown in FIG. 11, in which the stacking of different beam profiles 526 (intensity distribution in working plane) and the influence of misalignment on the integrated intensity is demonstrated for simple rectangular and parallelogram-shaped intensity profiles 526.

Figure 12:
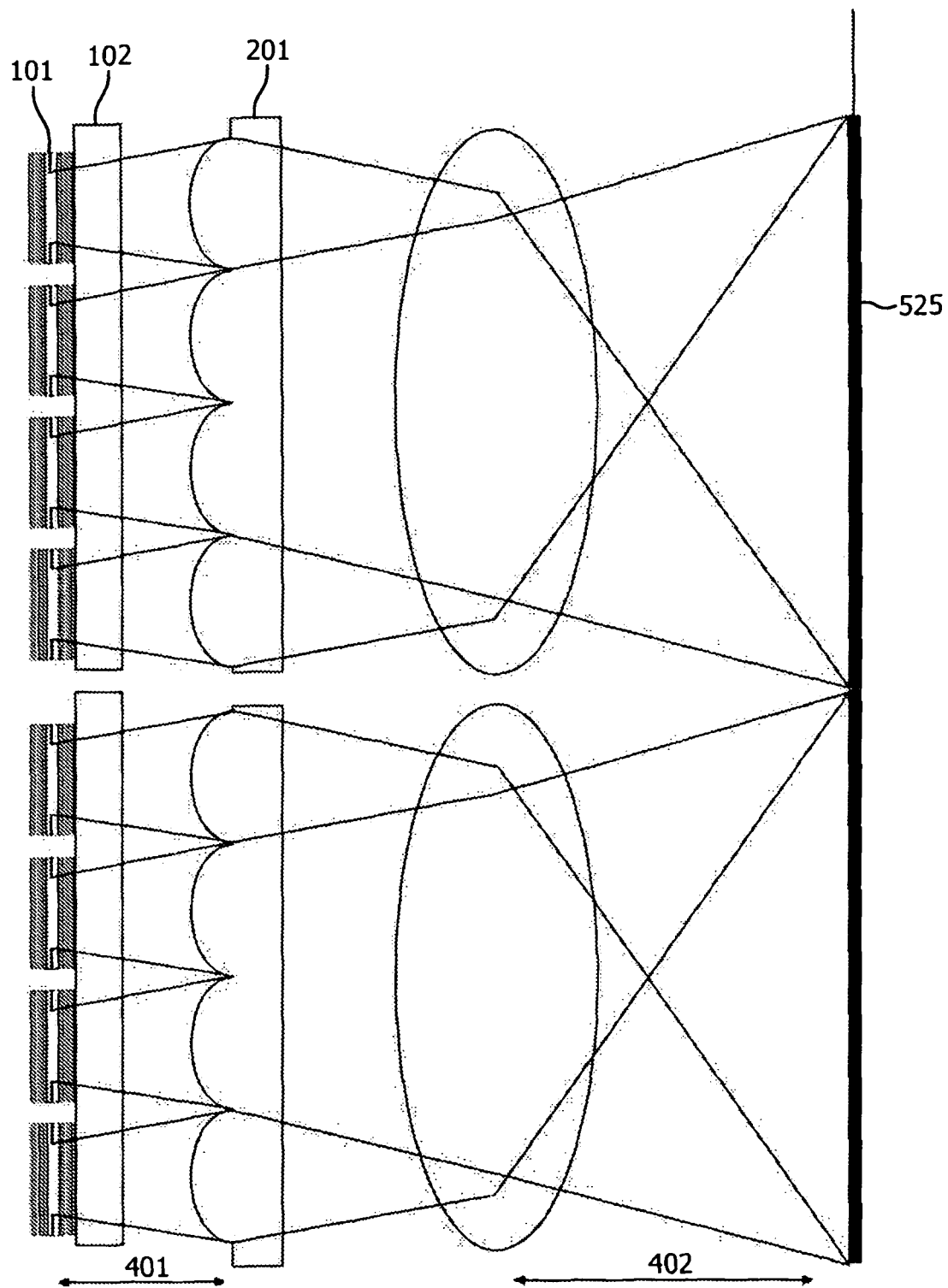
FIG. 12 a schematic view of a further embodiment of the proposed laser device.

A homogenous intensity distribution along the laser line can be achieved with different techniques. A first technique is to make the emission area of the VCSELs parallelogram-shaped (or triangle, . . . ), which can be done easily during processing of the wafer when fabricating the VCSEL array. Many VCSELs 101 are combined on one substrate 102. Due to the special properties of the large-area VCSELs 101 the emission area is filled homogenously. The light of each laser is collimated by a micro lens array 201 with the focal length 401 $f_1$ and then the near field of the laser module is imaged in the focal plane of lens 202 with focal length 402 $f_2$ as shown in FIG. 12. The emission area of the single laser times the magnification $M=f_2/f_1$ has to be larger than the size of the laser module in x-direction to close the gaps between the modules. The size of the beam in y-direction can be larger or smaller (preferably smaller for a thin line) by separating the lens 202 in two cylindrical lenses with different focal length $f_x$ and $f_y$ (see for example FIGS. 9 and 10). The length of the laser line 525 is set by stacking many laser modules next to each other.

Figure 13:
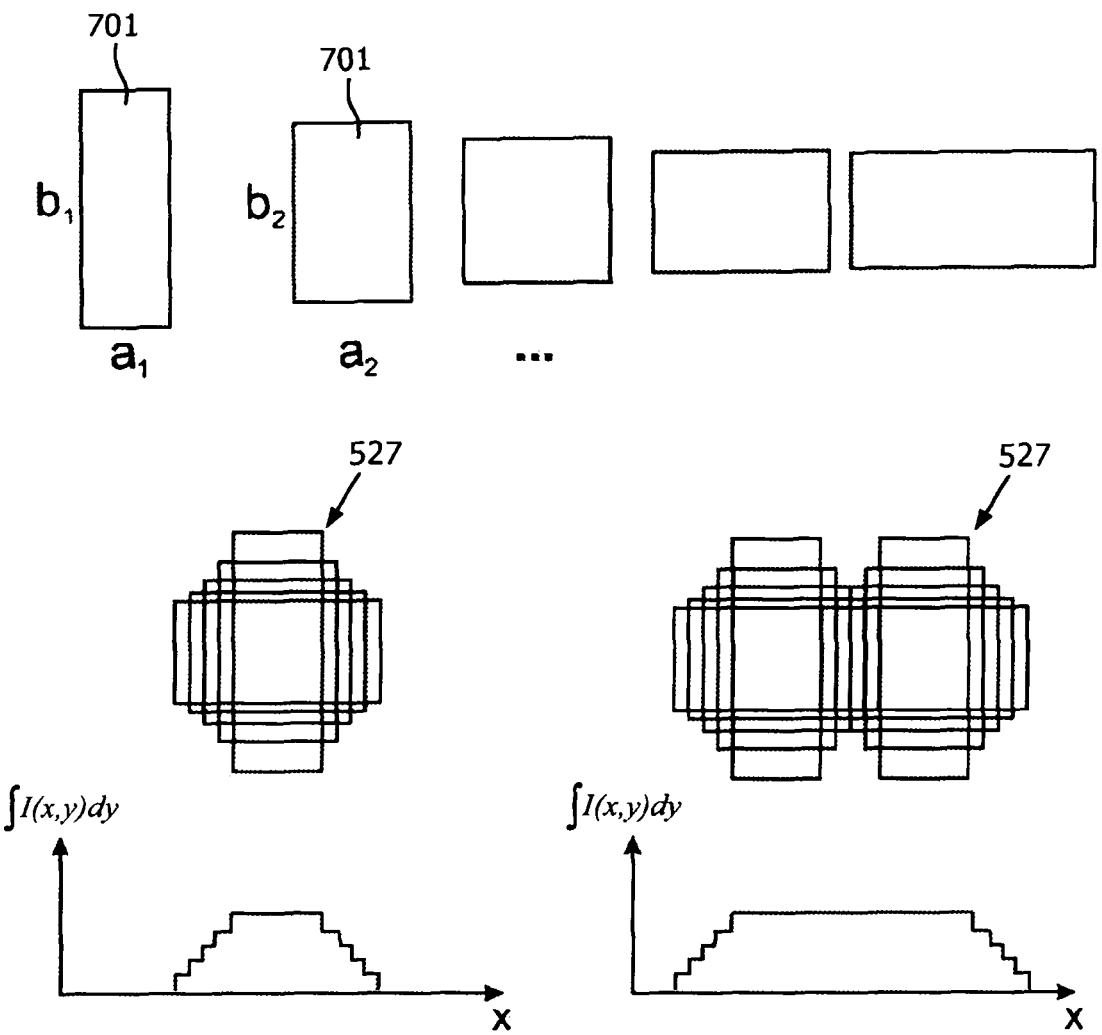
FIG. 13 an example of overlapping of rectangular shapes for generating a step-like integrated intensity profile.

A second technique is to generate an intensity distribution with step-like edges by overlapping many lasers of rectangular emission area with different lengths $a_i$ in x-direction. To facilitate the electrical driver, all lasers should have the same size of the emission area, i.e. $a_i \cdot b_i = $const, and therefore the same threshold current and voltage curve. One example is given in FIG. 13. The images of the near field of VCSELs with different rectangular shapes of the emission area 701 with different side lengths $a_i$ and $b_i$, but the same size $A=a_i b_i$ of the emission area are overlapped in the working plane (see overlapped intensity distribution 527). The integrated intensity in y-direction is then a step-like profile with a step height of the step I equal to $b_i * N_i * I_{Single}$, with $N_i$ being the total numbers of single lasers with this shape and $I_{Single}$ the intensity of one laser. The difference $\Delta a_i = a_i - a_{i+1}$ should be equal for all i. By matching the ratio of the numbers $N_i$ to the ratio of the length $b_i = A/a_i$ the same intensity step can be achieved at all positions.

In a variation of the second technique an intensity distribution with step-like edges is formed by overlapping many lasers of rectangular emission area with different lengths $a_i$ in x-direction and with the same length b. This results in a laser line with smoother edges. In order to get the same threshold current and voltage curve for driving the lasers in such a case, groups of lasers with an identical size of emission area electrically connected in parallel and the number of lasers of each group is selected such that each group has the same size of a total emission area, which is the sum of the emission areas of the lasers of each group. For example, a group of 10 lasers each having a size $A_1$ of its emission area is connected in parallel, a group of 12 lasers each having a size $A_2$ of its emission area with $A_2 = 5/6 \, A_1$ is connected in parallel etc.

In the following, further embodiments of the proposed laser device for generating a continuous laser line are described. The basic setup of these embodiments consists of:
- an array of VCSELs 101, which can be individual VCSELs soldered in an array configuration, a monolithical VCSEL array or an array of several monolithical VCSEL arrays;
- a micro lens array 201, 207, 208 with a lens in front of each VCSEL 101 to collimate the radiation emitted from that VCSEL; and
- a cylindrical lens (second lens 202) to focus down the radiation onto the desired line thickness D in the working distance of the working plane 501.

The line thickness D is determined by $D = d \ast f_2/f_1$ with d being the dimension of an individual VCSEL in the y-direction, $f_1$ the focal length of the micro lenses and $f_2$ the focal lens of the cylindrical lens. The focal length of the micro lenses is limited by the divergence $\theta$ of the VCSELs and the pitch p (=distance) between the centers of two individual VCSELs, as their radiation shall not overlap in the plane of the micro lenses. The aperture of the individual micro lenses is ideally equal to the pitch or slightly smaller. To achieve a narrow line and a large working distance at the same time, the dimension of the VCSEL d should be small and the pitch p between the VCSELs should be large, to allow a large focal length $f_1$.

To achieve a high intensity in the focus, several VCSELs are stacked in the y-direction, limited by the opening of the second lens. In the x-direction the situation is completely different. To get a homogenous intensity profile which is less dependent on failure of individual lasers or misalignment of the lasers or the optics, it is desirable to overlap the radiation of as many lasers as possible in each point on the laser line. Therefore a large divergence angle is desirable after the micro lens array, which means a large dimension l of the VCSEL in the x-direction and a short focal length, which allows a small pitch.

Figure 14:
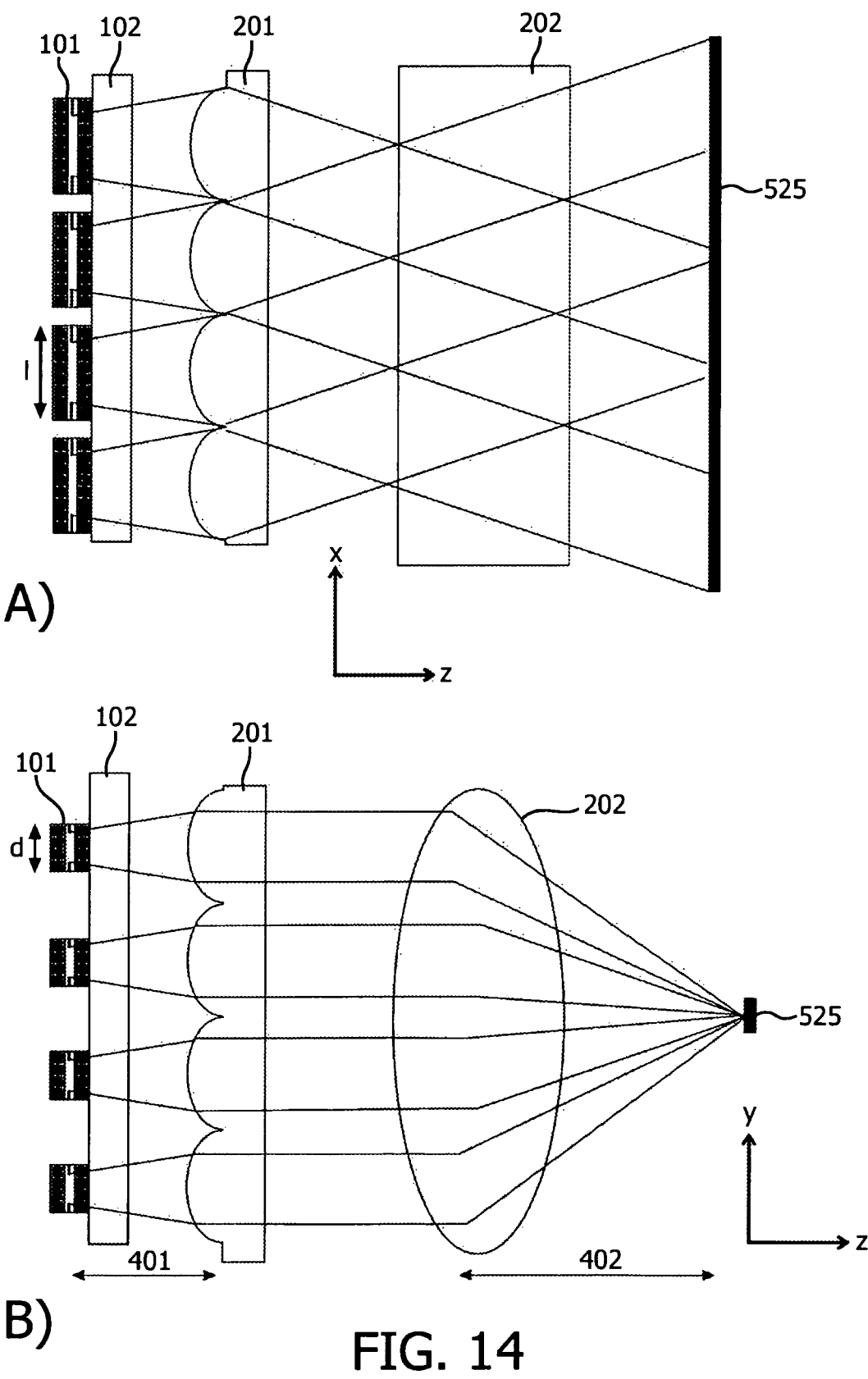
FIG. 14 a schematic view of a further embodiment of the proposed laser device.

With a micro lens array consisting of spherical lenses with a round or quadratic aperture, the pitch and the focal length has to be the same for both directions, but the dimensions of the VCSEL can be different. Such an embodiment is shown in FIG. 14, wherein FIG. 14A represents a view in y-direction, FIG. 14B a view in x-direction. As in the example of FIG. 2, the laser device consists of an array of large area VCSELs 101, monolithically integrated on a substrate 102. The emission of the lasers is collimated with a micro lens array 201, where the distance 401 between the active layers of the VCSELs and the micro lenses is equal to the effective focal length of these micro lenses. The second lens 202 in this example is a cylindrical lens which combines the images in a distance 402 equal to its focal length on the working plane. For a given working distance the focal length $f_2$ of the cylinder lens (second lens 202) is fixed. The desired line width D of the laser line 525 gives then the ratio $d/f_1$ or d/p. A combination of a small d and a small pitch p is preferable for thermal reasons, but d should be larger than 10 µm to get a homogenous intensity profile in the near field. For a given pitch p or diameter of the micro lenses, the other dimension l of the VCSEL is made as large as possible (see FIG. 14A), such that the radiation fills the complete aperture of the micro lenses in the x-direction. In the y-direction not the full aperture of the lens is used (see FIG. 14B).

Figure 15:
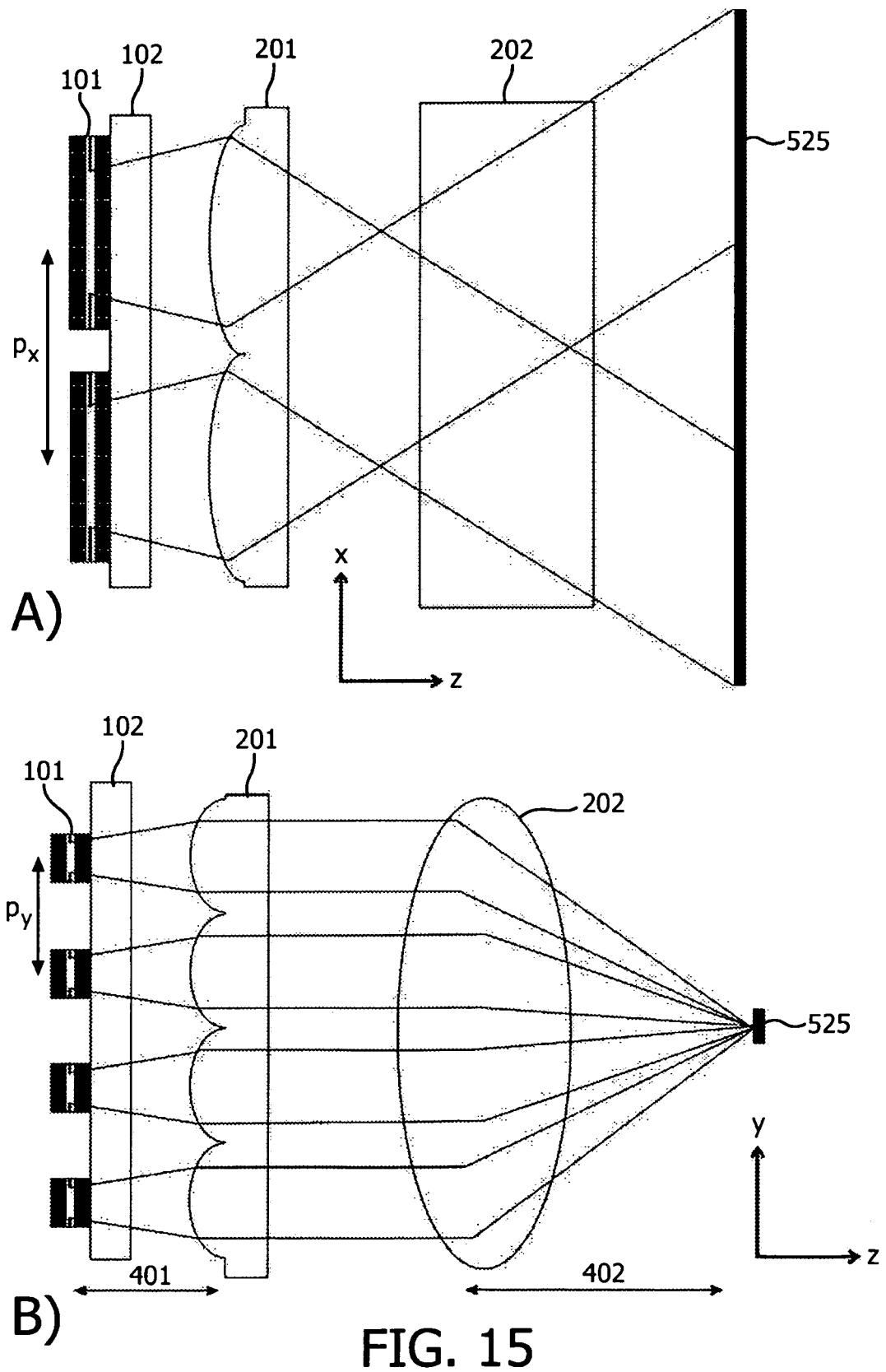
FIG. 15 a schematic view of a further embodiment of the proposed laser device.

This can be optimized by using micro lenses with the same focal length but an elliptical or rectangular aperture, the longer axis of which being oriented in the x-direction. Then the pitch of the lasers can be different for both directions with a smaller pitch $p_y$ in the y-direction compared to the pitch $p_x$ in the x-direction, such that the emission fills the complete aperture in both dimensions. This leads to a higher number of lasers in the y-direction and therefore to a higher power density of the laser module. Such an embodiment is shown in FIG. 15, wherein FIG. 15A represents a view in y-direction, FIG. 15B a view in x-direction. As the divergence angle after the micro-lenses $\theta'$ depends on the ratio of the VCSEL dimension and the focal lengths, the divergence angles can be different for both directions. In the y-direction $\theta'_y = d/f_1$ should be small, to allow the focussing on a small line with a large working distance, while $\theta'_x = l/f_1$ should be large for a strong mixing of the individual laser beams in the x-direction. By the use of a micro lens array with different apertures in both directions, both requirements can be fulfilled by having a large aperture $a_x$ in combination with a large l and a small aperture $a_y$ combined with a small d of the VCSEL. The elongated design of the VCSELs 101 and the correlating elongated aperture of the micro lenses of the micro lens array 201 can be recognized in FIGS. 15A/B.

Figure 16:
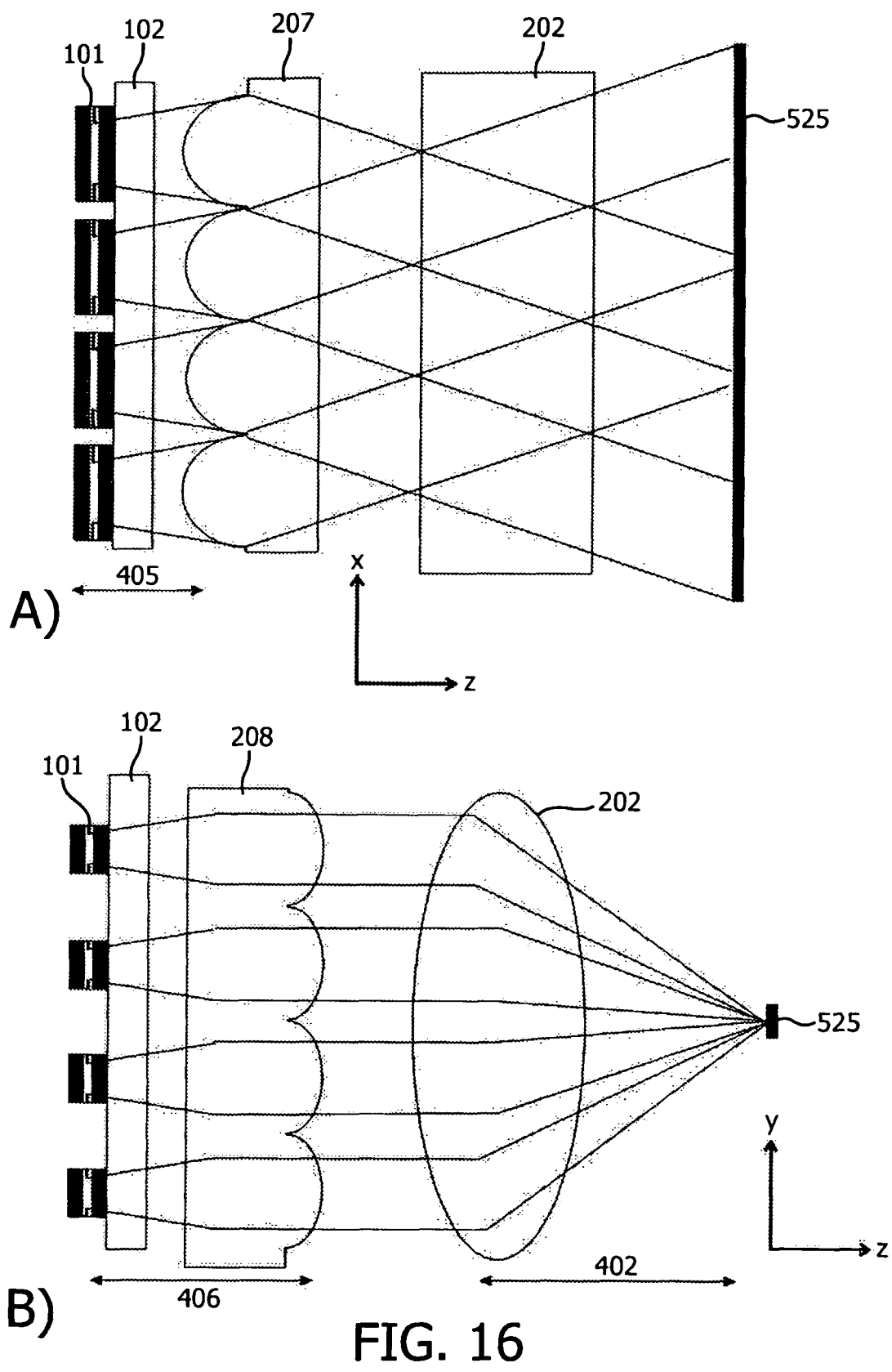
FIG. 16 a schematic view of a further embodiment of the proposed laser device.

In a further embodiment 2 cylindrical micro lens arrays 207, 208 are used one behind the other as shown in FIG. 16. FIG. 16A represents a view in y-direction, FIG. 16B a view in x-direction. The cylindrical micro lenses of the first array 207 are oriented perpendicular to the cylindrical micro lenses of the second array 208. This allows different focal lengths (corresponding to different distances 405, 406) for both directions and therefore increases the possibilities to set the divergence angles $\theta'_x$ and $\theta'_y$. The first and second cylindrical micro lens arrays 207, 208 can be two individual lens arrays or one substrate with the lens arrays on the opposite sites as shown in FIGS. 16A/B. The thickness of the substrate is determined by the difference in the focal length $f_{1,x}$ and $f_{1,y}$ divided by the refractive index of the substrate.

Although in the above embodiments the longer axis of the elongated aperture of the micro lenses is oriented in x-direction and the cylindrical axes of the crossed arrays of micro lenses are oriented perpendicular or parallel to the x-direction, these axes may also be slanted by an angle $\leq 45°$ from the x-direction (rotation about z-axis, perpendicular to x- and y-direction). With such a measure a special intensity distribution can be generated along the laser line.

Figure 17:
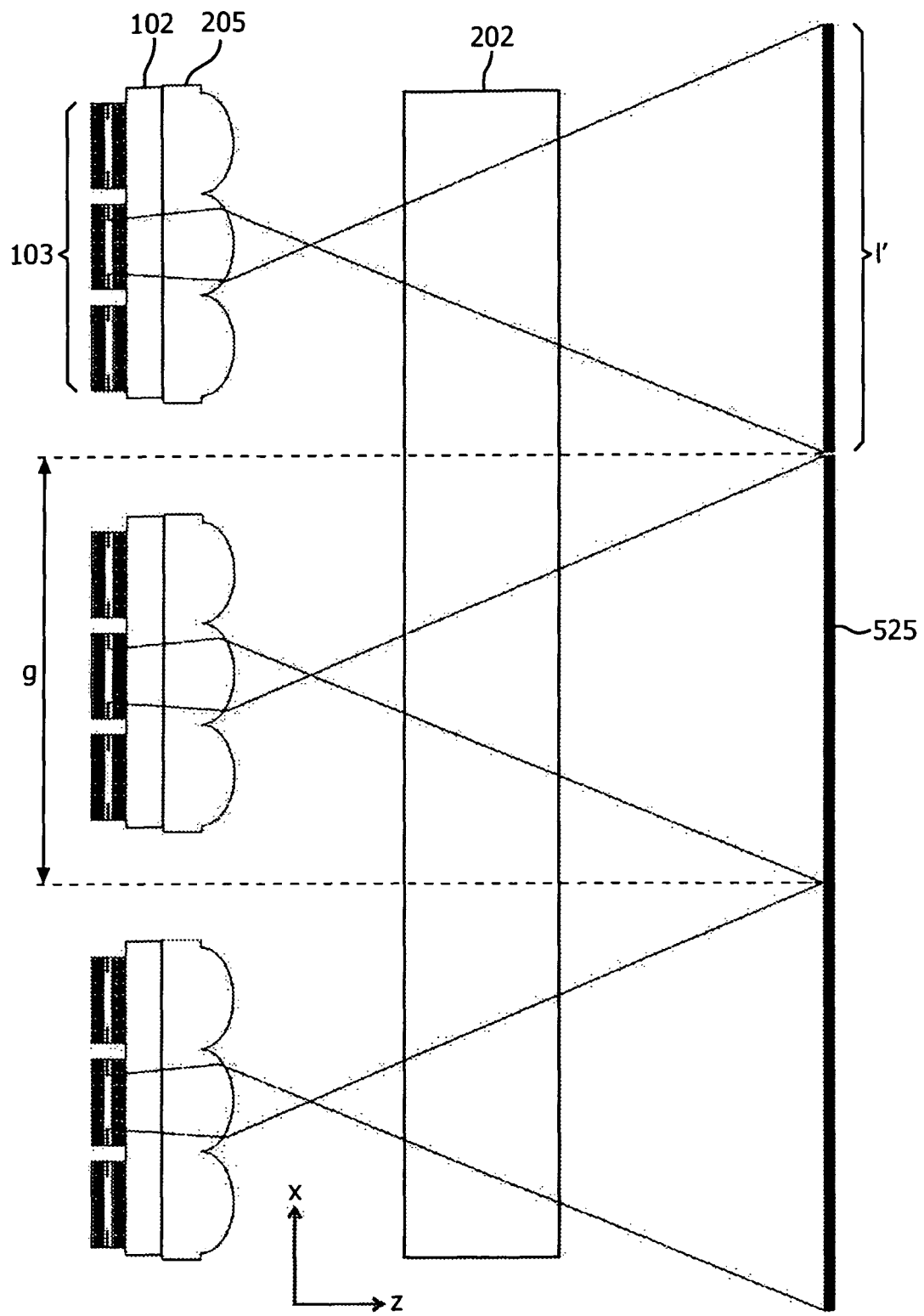
FIG. 17 a schematic view of a further embodiment of the proposed laser device.

When using laser modules 103, gaps will appear due to e.g. manufacturing or mounting limitations on the size of VCSEL-chips, submounts, optics, heat sinks, . . . . These gaps can introduce dips in the intensity profile which disturbs the homogeneity, as already explained with respect to FIGS. 9 and 10. In the proposed laser device, the gap pitch g (=gap periodicity) is matched to the size l' in x-direction of the intensity profile of an individual laser on the working plane, which is given approximately by the divergence angle after the micro lenses $\theta'_x$ and the distance S between the laser and the working plane. This is shown schematically in FIG. 17. For a length $l'=\tan(\theta')*S$, the gap pitch g should be $l'/N$ with N being any integer number. As the condition $g=l'$ is only fulfilled exactly in the working plane, the intensity profile will become more and more inhomogeneous the further it is away from the working plane. We define the depth of focus as the maximum distance $\Delta z$ from the working plane, where the requirements on the homogeneity are fulfilled.

To further increase the homogeneity, depth of focus and alignment tolerances, the shapes of the VCSELs are selected—different from a rectangular shape—to give a smooth integrated intensity profile instead of a top-hat profile. Such shapes are already described in connection with FIG. 11. These shapes can be e.g. parallelograms, trapezoids, triangles, hexagons or rhombi. The larger the shoulder of the intensity profile, the larger are the alignment tolerances and the depth of focus.

Figure 18:
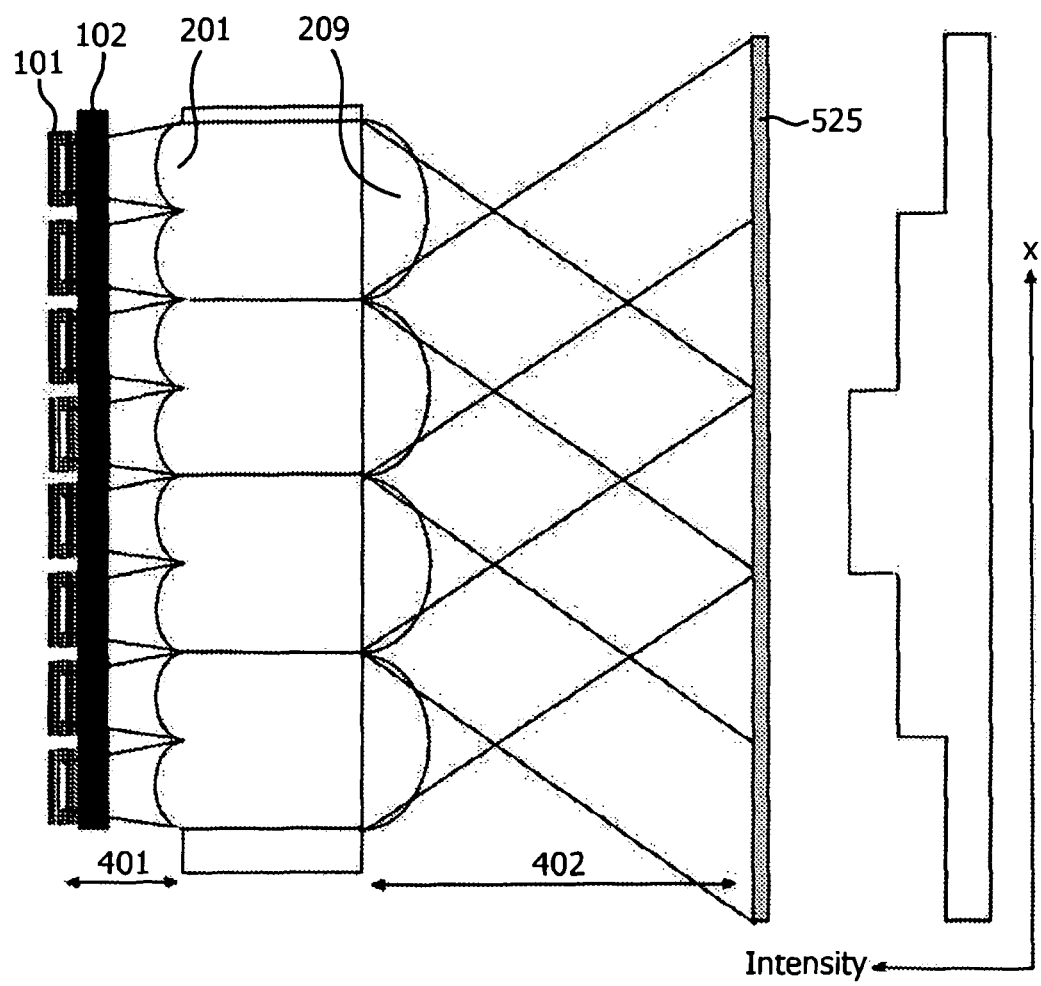
FIG. 18 a schematic view of a further embodiment of the proposed laser device.

A further embodiment of the proposed laser device is shown in FIG. 18. In this embodiment an array of C cylindrical lenses 209 in x-direction is added, the cylindrical lenses having a focal length $f_{2,x}$ equal to the distance 402 of the lens array to the working plane. This gives a step-like intensity profile of the laser line 525 at the edges with C steps, where C can be equal the number $N_x$ of lasers in the x-direction or equal to $N_x$ divided by an integer number.

In further embodiments, this array of cylindrical lenses 209 may also be tilted (rotated by an angle around z-axis) or replaced by an array of $N_y \times C$ cylindrical lenses ($N_y$ being the number of lasers in y-direction) with the same focal length and a square or rectangular aperture. The individual lenses 209 in the former embodiment are splitted into $N_y$ parts and slightly shifted in x-direction from VCSEL to VCSEL in y-direction.

Figure 19:
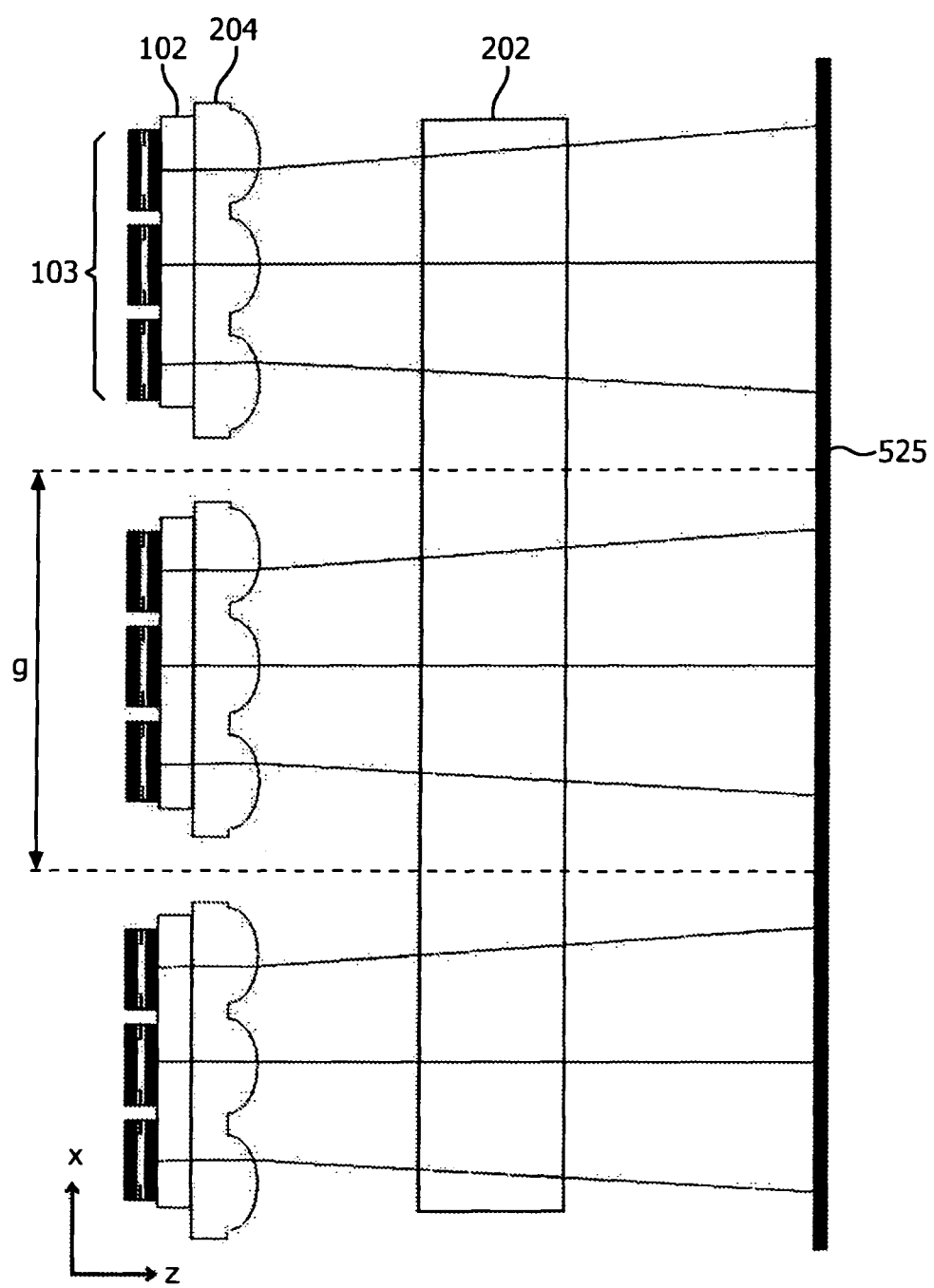
FIG. 19 a schematic view of a further embodiment of the proposed laser device.

A further embodiment of the proposed laser device is shown in FIG. 19. In this embodiment, a chirped micro lens array 204 (or equivalent, a chirped laser array) is used, such that only a fraction 1/K of the lenses is centered with respect to the lasers, with $K=N_x/N$ ($N=1, 2, 3, \ldots$). The other groups of micro lenses are shifted with respect to the lasers by different distances such that all images are equidistant on the working plane and gaps caused by the gap pitch g between the laser modules 103 are closed.

The micro lens array(s) of the proposed laser device may be mounted on posts on the same insulating submounts on which the VCSEL arrays are soldered. The micro lens array(s) of the proposed laser device may also be directly bonded/soldered/glued to the VCSEL arrays. When using laser modules, several modules are preferably mounted on a common rail incl. coolant support through the common rail.

While the invention has been illustrated and described in detail in the drawings and forgoing description, such illustration and description are to be considered illustrative or exemplary and not restrictive. The invention is not limited to the disclosed embodiments. The different embodiments described above and in the claims can also be combined. Other variations to the disclosed embodiments can be understood and effected by those skilled in the art in practicing the claimed invention, from the study of the drawings, the disclosure and the appended claims. For example, the number of the VCSELs and/or subgroups used in the array is not limited. The VCSELs may be designed to provide any shape of its intensity distribution in the near field which is required in the working plane. The number of different shapes to be combined in the working plane only depends on the desired application. Furthermore, the measures in order to achieve the desired geometrical shape of the intensity distribution in the near field are also not limited to the disclosed examples.

In the claims the word "comprising" does not exclude other elements or steps, and the indefinite article "a" or "an" does not exclude a plurality. The mere fact, that the measures are recited in mutually different dependent claims does not indicate that a combination of these measures can not be used to advantage. The reference signs in the claims should not be construed as limiting the scope of these claims.

LIST OF REFERENCE SIGNS

101 VCSEL
102 substrate
103 laser module
111-114 sub group of VCSELs
121-124 shapes of intensity distribution in the near field
201 micro lens array
202 second lens
203 substrate with micro lenses
204 chirped micro lens array
205 micro lens array on substrate
206 macroscopic lenses
207 first micro lens array
208 second micro lens array
209 array of cylindrical lenses
401 distance between active layer and micro lens
402 distance between working plane and second lens
403 distance between active layer and micro lens
404 distance between micro lens and working plane
405 distance between active layer and first micro lens array
406 distance between active layer and second micro lens array
501 working plane
511 image in working plane
520 intensity distribution in working plane
521-524 intensity distribution in working plane
525 laser line
526 beam profile
527 overlapped intensity distribution
601 control unit
701 shape of emission area

The invention claimed is:

1. A laser device comprising:
    an array of several large area vertical cavity surface emission lasers, each of said lasers comprising an active layer emitting laser radiation;
    at least one optics configured and arranged to image the active layers of the lasers of said array to a working plane such that the laser radiation emitted by the active layers of all lasers or of subgroups of lasers of the array superimposes in the working plane; and,
    wherein said array comprises at least a first and a second vertical cavity surface emission laser being individually switchable by a control unit,
    said first laser being configured to emit a laser beam with a first shape of intensity distribution in the near field,
    said second laser being configured to emit a laser beam with a second shape of intensity distribution in the near field different from the first shape,
    such that shaping of a laser beam profile in the working plane is enabled.

2. The laser device according to claim 1, wherein at least some of said lasers are configured to emit laser beams with different shapes of intensity distribution in the near field, said lasers comprising different geometrical shapes and/or different diameters of an emission area or emission aperture.

3. The laser device according to claim 1, wherein said optics comprises an array of micro lenses and one or several field lenses.

4. The laser device according to claim 1, wherein said optics comprises an array of micro lenses, said micro lenses being arranged off axis with respect to beam axes of the lasers.

5. The laser device according to claim 1, wherein said array comprises n vertical cavity surface emission lasers and said optics comprises n micro lenses and m field lenses, wherein n=a*m, a=2, 3, . . . , each micro lens being arranged in front of a laser and each field lens being arranged to image intensity distributions of a subgroup of lasers to the working plane such that said intensity distributions of all lasers of the subgroup superimpose at a position in the working plane, the positions of the different subgroups being different from one another.

6. The laser device according to claim 1, wherein said optics is configured to generate a non-sharp image of the active layers in the working plane.

7. The laser device according to claim 1, wherein said optics is configured and arranged to image the active layers of adjacent subgroups of lasers side by side, preferably partly overlapping, so as to generate a continuous laser line or laser area in the working plane, said laser line extending in a first direction.

8. The laser device according to claim 7, wherein said lasers of each subgroup are configured to emit laser beams with elongated shapes of intensity distribution in the near field, in particular with rectangular or parallelogram-like shapes, said elongated shapes having a larger extension in the first direction than in a second direction perpendicular to the first direction.

9. The laser device according to claim 8, wherein said lasers of each subgroup are configured to emit laser beams with rectangular shapes of different dimensions in the near field, said dimensions being selected to generate a superimposed integrated intensity profile having a constant central part and stepwise decreasing edges along the laser line in the working plane.

10. The laser device according to claim 8, wherein said optics is configured to image the active layers of all lasers of each subgroup to exactly superpose in a second direction in the working plane, the second direction being perpendicular to the first direction.

11. The laser device according to claim 8, wherein said subgroups of lasers or groups of said subgroups of lasers are separated from one another in the first direction by a gap, and said optics is configured to image the active layers of the lasers of each subgroup to an image size in the first direction in the working plane which is an integer multiple of the gap periodicity.

12. The laser device according to claim 1, further comprising a control unit for controlling the power of each of the subgroups of lasers and a measurement unit connected to the control unit, the measurement unit being configured and arranged to measure power levels of the individual subgroups to provide a feedback for the control unit.

13. The laser device according to claim 1, wherein said optics is configured to provide different magnification factors in perpendicular directions.

14. The laser device of claim 1, wherein each of said large area vertical cavity surface emission lasers has an emission area $\geq 80\ \mu m^2$.

15. The laser device of claim 1, wherein each of said large area vertical cavity surface emission lasers has an emission area $\geq 300\ \mu m^2$.

16. A laser device comprising
an array of several large area vertical cavity surface emission lasers, each of said lasers comprising an active layer emitting laser radiation, wherein said emitted laser radiation is dominated by Fourier modes;
at least one optics configured and arranged to image the active layers of the lasers of said array to a working plane such that the laser radiation emitted by the active layers of all lasers or of subgroups of lasers of the array superimposes in the working plane; and,
wherein at least some of said lasers are configured to emit laser beams with different shapes of intensity distribution in the near field.

17. The laser device according to claim 16, wherein said array comprises at least a first and a second vertical cavity surface emission laser being individually switchable by a control unit, said first laser being configured to emit a laser beam with a first shape of intensity distribution in the near field, said second laser being configured to emit a laser beam with a second shape of intensity distribution in the near field different from the first shape.

18. The laser device according to claim 17, wherein said array comprises at least one or several further vertical cavity surface emission lasers being individually switchable by the control unit and configured to emit a laser beam with one or several further shapes of intensity distribution in the near field different from the first and second shape.

* * * * *